(12) United States Patent
Turney et al.

(10) Patent No.: US 12,302,541 B2
(45) Date of Patent: May 13, 2025

(54) STABLE PUMPED TWO-PHASE COOLING

(71) Applicant: Hamilton Sundstrand Corporation, Charlotte, NC (US)

(72) Inventors: Joseph E. Turney, Amston, CT (US); Raphael Mandel, West Hartford, CT (US); Ram Ranjan, West Hartford, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 330 days.

(21) Appl. No.: 17/944,641

(22) Filed: Sep. 14, 2022

(65) Prior Publication Data
US 2024/0090186 A1    Mar. 14, 2024

(51) Int. Cl.
*H05K 7/20*    (2006.01)

(52) U.S. Cl.
CPC ....... *H05K 7/20936* (2013.01); *H05K 7/2039* (2013.01)

(58) Field of Classification Search
CPC .............. H05K 7/203; H05K 7/20809; H05K 7/20781; H05K 7/20772; H05K 7/20272; H05K 7/20236; H05K 7/20836; H05K 7/1487; H05K 7/1488; H05K 7/1489; H05K 7/20; H05K 7/20254; H05K 7/20327; H05K 7/20336; H05K 7/2039; H05K 7/2079; H05K 7/20636; H05K 7/20727; H05K 7/20818; H05K 7/20827; F25B 2600/2515; F25B 41/20; F25B 41/40; F25B 2600/2523; F25B 2600/2501; F25B 2700/191; F28F 2250/08; F28F 3/12; G06F 1/20; G06F 2200/201; B64D 2013/0614; B60H 1/32
See application file for complete search history.

(56) References Cited

U.S. PATENT DOCUMENTS 6,330,800 B1   12/2001   Price et al.
6,742,345 B2   6/2004    Carr
(Continued)

FOREIGN PATENT DOCUMENTS

GB   2548123 A   9/2016

OTHER PUBLICATIONS

Extended European Search Report; Application No. 23196993.2; dated Jan. 17, 2024; 10 pages.

*Primary Examiner* — Michael A Matey
(74) *Attorney, Agent, or Firm* — CANTOR COLBURN LLP

(57) ABSTRACT

Cooling systems include a cold sink having a number of heat load cooling paths and a heat load associated with each cooling path. An inlet is configured to supply a cooling fluid into the cold sink and an outlet is configured to receive the cooling fluid after passing through the plurality of heat load cooling paths of the cold sink. A pressure regulating element is arranged along each cooling path, each pressure regulating element arranged between the inlet and the heat load along each cooling path and configured to cause a pressure drop in the cooling fluid prior to passing the cooling fluid to each heat load. The pressure drop caused by each pressure regulating element is the same and is a pressure drop greater than a maximum pressure drop across each heat load of a system without such pressure regulating elements.

20 Claims, 5 Drawing Sheets

(56) References Cited

U.S. PATENT DOCUMENTS

| | | | |
|---|---|---|---|
| 9,282,678 B2* | 3/2016 | Campbell | H05K 7/20772 |
| 10,017,032 B2 | 7/2018 | Behrens et al. | |
| 11,092,031 B2 | 8/2021 | Frank et al. | |
| 11,231,209 B2* | 1/2022 | Cavalleri | F25B 41/39 |
| 11,273,925 B1* | 3/2022 | O'Meallie | F28D 15/025 |
| 2011/0315353 A1* | 12/2011 | Campbell | H05K 7/20809 |
| | | | 165/104.31 |
| 2011/0315355 A1* | 12/2011 | Campbell | H05K 7/20809 |
| | | | 165/104.33 |
| 2011/0317367 A1* | 12/2011 | Campbell | H05K 7/203 |
| | | | 361/700 |
| 2013/0000335 A1 | 1/2013 | Borror et al. | |
| 2013/0019614 A1* | 1/2013 | Campbell | H05K 7/20209 |
| | | | 62/62 |
| 2013/0105120 A1* | 5/2013 | Campbell | H05K 7/203 |
| | | | 165/104.21 |
| 2013/0105122 A1* | 5/2013 | Campbell | H05K 7/20809 |
| | | | 165/104.26 |
| 2014/0071626 A1* | 3/2014 | Campbell | B23P 15/26 |
| | | | 165/165 |
| 2014/0102132 A1* | 4/2014 | Hinde | F25B 43/006 |
| | | | 62/612 |
| 2014/0124174 A1* | 5/2014 | Campbell | H05K 7/20809 |
| | | | 29/890.035 |
| 2014/0133099 A1* | 5/2014 | Campbell | H05K 7/20818 |
| | | | 361/698 |
| 2015/0109728 A1* | 4/2015 | Campbell | H05K 7/20336 |
| | | | 361/679.47 |
| 2015/0109735 A1* | 4/2015 | Campbell | H05K 7/2079 |
| | | | 361/700 |
| 2015/0359132 A1* | 12/2015 | Campbell | H05K 7/20236 |
| | | | 361/700 |
| 2016/0120065 A1* | 4/2016 | Shedd | F28F 9/26 |
| | | | 165/104.29 |
| 2016/0270267 A1* | 9/2016 | Chainer | H05K 7/20781 |
| 2017/0177041 A1* | 6/2017 | Shelnutt | H05K 7/20809 |
| 2018/0299933 A1* | 10/2018 | Cui | H05K 7/20772 |
| 2019/0320548 A1* | 10/2019 | Gao | H05K 7/1488 |
| 2019/0348345 A1* | 11/2019 | Parida | H01L 25/18 |
| 2019/0373776 A1* | 12/2019 | Gao | H05K 7/20772 |
| 2021/0298202 A1* | 9/2021 | Shao | H05K 7/20272 |
| 2022/0357082 A1* | 11/2022 | Unton | F25B 25/005 |

\* cited by examiner

STABLE PUMPED TWO-PHASE COOLING

BACKGROUND

The subject matter disclosed herein generally relates to cooling systems and, more particularly, to vapor compression cycles with stable pumped two-phase cooling.

Some conventional cooling systems on aircraft utilize air cycle cooling. Hot, pressurized air from the engine is cooled and compressed and used to cool avionics systems and environmental systems, such as the cabin and flight deck. Advancements in composite materials have introduced light yet strong composite components to replace heavier metal components on aircraft. For example, aircraft wings can contain multiple composite components to form a largely composite wing. Composite components do have certain drawbacks, however. Some composite components cannot withstand the high temperatures of the pressurized air bled from the engine that is used for cooling. Thus, using conventional air cycle cooling alone can be unsuitable in some aircraft constructed with composite components. In these cases, alternate cooling systems must be used.

Thermal management of temperature-sensitive components under harsh environments may require a coolant at temperatures below ambient temperature. Typically, this is accomplished using a vapor compression cycle to chill a secondary (indirect) coolant to a required sub-ambient temperature, at the expense of system efficiency, size, and weight due to the required additional components and inefficiencies. Conventional vapor cycle cooling utilizes hydrofluorocarbon refrigerants, such as R-134a. Refrigerant vapor cycle systems offer good performance relative to system weight. Minimizing the weight of aircraft systems increases efficiency of the aircraft and reduces fuel consumption. However, due to environmental concerns and potential regulations, reducing or eliminating the use of R-134a and similar refrigerants is desirable. Other refrigerants, such as carbon dioxide, have lower global warming potential. However, conventional carbon dioxide cooling systems are too heavy to be used in aircraft without incurring a substantial negative effect to efficiency and fuel consumption. Accordingly, it may be desirable to have systems that are more efficient, provide lower weight, and may provide less risk to the environment.

SUMMARY

According to some embodiments, cooling systems are provided. The cooling systems include a cold sink comprising a plurality of heat load cooling paths, a heat load associated with each heat load cooling path of the plurality of heat load cooling paths, an inlet configured to supply a cooling fluid into the cold sink, an outlet configured to receive the cooling fluid after passing through the plurality of heat load cooling paths of the cold sink, and a pressure regulating element arranged along each heat load cooling path, each pressure regulating element arranged between the inlet and the heat load along each heat load cooling path and configured to cause a pressure drop in the cooling fluid prior to passing the cooling fluid to each heat load. The pressure drop caused by each pressure regulating element is the same and is a pressure drop greater than a maximum pressure drop across each heat load of a system without such pressure regulating elements.

In addition to one or more of the features described herein, or as an alternative, further embodiments of the cooling systems may include that the cooling fluid is 1,1,1,2-Tetrafluoroethane (R-134a), a mixture of difluoromethane and pentafluoroethane (R-410A), 2,3,3,3-Tetrafluoropropene (R-1234yf), or 1,1,1,3,3,3-Hexafluoropropane (236fa).

In addition to one or more of the features described herein, or as an alternative, further embodiments of the cooling systems may include that the heat load is a powered electronics component of an aircraft.

In addition to one or more of the features described herein, or as an alternative, further embodiments of the cooling systems may include a pump arranged upstream of the inlet.

In addition to one or more of the features described herein, or as an alternative, further embodiments of the cooling systems may include an evaporator arranged downstream of the outlet.

In addition to one or more of the features described herein, or as an alternative, further embodiments of the cooling systems may include that the pressure drop of each pressure regulating element is at least ten times greater than the maximum pressure drop.

In addition to one or more of the features described herein, or as an alternative, further embodiments of the cooling systems may include an inlet manifold arranged between the inlet and the pressure regulating elements.

In addition to one or more of the features described herein, or as an alternative, further embodiments of the cooling systems may include an outlet manifold arranged between the heat loads and the outlet.

In addition to one or more of the features described herein, or as an alternative, further embodiments of the cooling systems may include that each pressure regulating element is a valve.

In addition to one or more of the features described herein, or as an alternative, further embodiments of the cooling systems may include that each pressure regulating element is an orifice along each heat load cooling path.

In addition to one or more of the features described herein, or as an alternative, further embodiments of the cooling systems may include that the cooling fluid is a liquid at the inlet and a two-phase fluid at the outlet.

In addition to one or more of the features described herein, or as an alternative, further embodiments of the cooling systems may include a separator arranged downstream from the outlet and configured to receive the cooling fluid and separate such fluid into a liquid flow path and a vapor flow path, wherein each of the liquid flow path and a vapor flow path define a closed-loop system centered on the cold sink.

In addition to one or more of the features described herein, or as an alternative, further embodiments of the cooling systems may include a pump arranged downstream from the separator and upstream of the cold sink along the liquid flow path, the pump configured to boost a pressure of the cooling fluid in the liquid flow path.

In addition to one or more of the features described herein, or as an alternative, further embodiments of the cooling systems may include a compressor, a condenser, and an expansion valve arranged along the vapor flow path downstream from the separator and upstream from the cold sink.

According to some embodiments, aircraft cooling systems are provided. The aircraft cooling systems include a plurality of aircraft heat loads and cooling system. The cooling system includes a cold sink comprising a plurality of heat load cooling paths, wherein each heat load cooling path is associated with one of the plurality of aircraft heat loads, an inlet configured to supply a cooling fluid into the cold sink, an outlet configured to receive the cooling fluid after passing through the plurality of heat load cooling paths of the cold sink, and a pressure regulating element arranged along each heat load cooling path, each pressure regulating element arranged between the inlet and the heat load along each heat load cooling path and configured to cause a pressure drop in the cooling fluid prior to passing the cooling fluid to each heat load. The pressure drop caused by each pressure regulating element is the same and is a pressure drop greater than a maximum pressure drop across each heat load of a system without such pressure regulating elements.

In addition to one or more of the features described herein, or as an alternative, further embodiments of the aircraft cooling systems may include that the heat load comprises at least one power electronics component of an aircraft.

In addition to one or more of the features described herein, or as an alternative, further embodiments of the aircraft cooling systems may include that the pressure drop of each pressure regulating element is at least ten times greater than the maximum pressure drop.

In addition to one or more of the features described herein, or as an alternative, further embodiments of the aircraft cooling systems may include an inlet manifold arranged between the inlet and the pressure regulating elements and an outlet manifold arranged between the heat loads and the outlet.

In addition to one or more of the features described herein, or as an alternative, further embodiments of the aircraft cooling systems may include that each pressure regulating element is a one of a valve or an orifice along each heat load cooling path.

In addition to one or more of the features described herein, or as an alternative, further embodiments of the aircraft cooling systems may include that the cooling fluid is a liquid at the inlet and a two-phase fluid at the outlet.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The subject matter is particularly pointed out and distinctly claimed at the conclusion of the specification. The foregoing and other features, and advantages of the present disclosure are apparent from the following detailed description taken in conjunction with the accompanying drawings in which:

DETAILED DESCRIPTION

Figure 1:
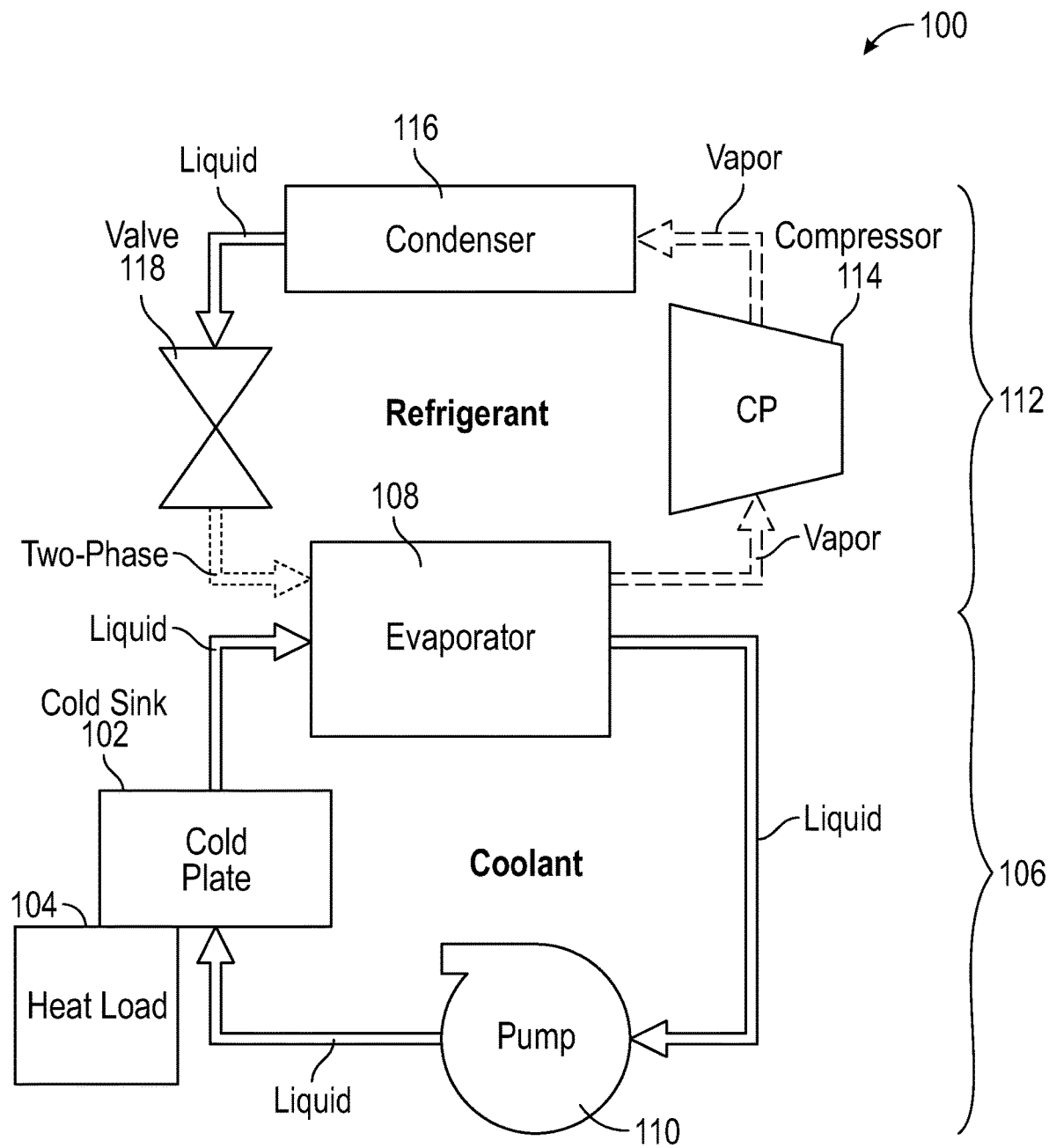
FIG. 1 is a schematic illustration of a two-fluid cooling system that may incorporate embodiments of the present disclosure.

As shown and described herein, various features of the disclosure will be presented. Various embodiments may have the same or similar features and thus the same or similar features may be labeled with similar reference numerals. Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

Referring to FIG. 1, a schematic illustration of a two-fluid cooling cycle 100 is shown. The two-fluid cooling cycle 100 is configured to provide a cold sink 102 that is thermally coupled with one or more components and/or fluids associated with one or more components (illustrated as heat load 104), to provide cooling thereto. For example, in some embodiments or configurations, the cold sink 102 may be a cold plate having internal fluid passages for receiving a fluid of the two-fluid cooling cycle 100 which absorbs heat from the heat load 104. The heat load 104 may be powered electronics of an aircraft, a working fluid line of a cooling loop/cycle, or the like, and/or portions thereof as will be appreciated by those of skill in the art. The heat load 104, and heat loads described and employed herein, may be, for example and without limitation, electronic devices such as computer processes, motor controllers, radio/radar systems, power amplifiers, diodes, inductors, motors, and/or other electric and/or electronic devices.

To operate as a source of heat removal from the heat load 104, the cold sink 102 is part of a coolant loop 106. The coolant loop 106 is a closed-loop system that includes the cold sink 102, an evaporator 108, and a pump 110. The coolant loop 106 includes a coolant fluid within a closed-loop flow path that passes from the cold sink 102, into and through the evaporator 108, is pumped in pressure at the pump 110, and returned to the cold sink 102. As the coolant passes through the cold sink 102, it will pick up heat from the heat load 104 and increase in temperature. The heated coolant will then enter the evaporator 108 where excess heat will be extracted and the coolant will be cooled. The cooled coolant will then be increased in pressure at the pump 110 to ensure that the coolant is in a liquid phase prior to entering the cold sink 102. It will be appreciated that in some configurations, the coolant of the coolant loop 106 remains in a liquid phase throughout the coolant loop 106, thereby preventing or avoiding maldistribution or other complications due to phase changes and/or flow disruptions.

The heat picked up by the coolant of the coolant loop 106 within the cold sink 102 is removed at the evaporator 108. The evaporator 108 is part of the coolant loop 106 and part of a refrigerant loop 112. The evaporator 108 receives, as a first working fluid, the coolant of the coolant loop 106 and, as a second working fluid, a refrigerant of the refrigerant loop 112. The refrigerant will pick up heat from the coolant of the coolant loop 106 within the evaporator 108 and enter a vapor phase. The heated refrigerant (vapor) will then be compressed within a compressor 114, condensed (from vapor to liquid) within a condenser 116 (e.g., a heat exchanger to remove heat), and then expanded within or through a valve 118 before returning to the evaporator 108 as a two-phase fluid, where it will pick up heat and evaporate into the vapor phase through interaction with the heated coolant of the coolant loop 106 within the evaporator 108. The valve 118 may be an expansion valve, controllable valve, or the like, as will be appreciated by those of skill in the art.

Thermal management of temperature-sensitive components under harsh environments often require a coolant at temperatures below ambient. The two-fluid cooling cycle 100 shown in FIG. 1 provides such cooling. A vapor compression cycle (e.g., refrigerant loop 112) is used to chill a secondary (indirect) coolant (e.g., coolant loop 106) to required sub-ambient temperatures (FIG. 1), at the expense of system efficiency, size, and weight due to the required components and inefficiencies. For example, excess vapor cycle temperatures lift may be required to drive heat transfer in an evaporator. Further, relatively large flow rates may be required in a liquid portion of the loop(s) to maintain consistent cooling for high heat loads. Furthermore, additional temperature lift may be quired to drive heat transfer in the condenser, particularly if the coolant temperature is below ambient. These and other inefficiencies may be addressed, at least in part, through implementations of embodiments of the present disclosure.

In the two-fluid cooling cycle 100 of FIG. 1, two separate working fluids are used. A coolant is used in the coolant loop 106 and a separate refrigerant is used in the refrigerant loop 112. In some configurations, the coolant of the coolant loop 106 may be, for example and without limitation, water, propylene-glycol water mixture, ethylene-glycol water mixture, etc., and the refrigerant of the refrigerant loop 112 may be, for example and without limitation, 1,1,1,2-Tetrafluoroethane (R-134a), a mixture of difluoromethane and pentafluoroethane (R-410A), 2,3,3,3-Tetrafluoropropene (R-1234yf), or 1,1,1,3,3,3-Hexafluoropropane (236fa), etc. Using two separate fluids can result in inefficiencies, such as requiring two separate fluid systems, ensuring proper thermal exchange occurs at the correct locations of the respective loops, and the like.

In view of the above and to provide other advantages, embodiments of the present disclosure are directed to single fluid cooling systems. In accordance with embodiments of the present disclosure, a refrigerant system/loop is used to directly cool the sensitive components (e.g., heat load 104) via an evaporator cold plate (e.g., cold sink 102), thereby eliminating the additional components associated with the indirect loop and their inefficiencies (i.e., components of the refrigerant loop 112). This is achieved through two-phase cooling, where a working fluid is converted between different phase states to accommodate thermal pick up and operate as a heat sink to the respective component(s) and/or system(s). In single-fluid, two-phase cooling systems, using a two-phase mixture coming directly from an expansion valve (e.g., valve 118) of the vapor compression cycle (e.g., refrigerant loop 112) can be problematic, as two-phase flow can present flow maldistribution issues that result in system failure under high heat loads.

In some embodiments, the system 100 may be configured to use a single fluid, such as a two-phase fluid. In some such embodiments, the evaporator 108 may be replaced by a separator (e.g., gravity separator or the like). The separator may be configured to receive a single stream/mixture from the two loops 106, 112 and to separate the cooling fluid into two flow streams, one for a vapor loop (e.g., equivalent to the refrigerant loop 112) and one for a liquid loop (e.g., equivalent to the coolant loop 106).

Embodiments of the present disclosure are directed to passive flow controllers configured to control flow through a heat load cooling path of a heat load to accommodate different loads while ensuring cooling to various connected components. In accordance with some embodiments of the present disclosure, a high pressure drop element, such as a valve, flow restrictor, orifice, or the like, is arranged upstream of each heat load cooling path in a cold sink. As such, the majority of the pressure drop through each parallel heat load cooling path occurs in the pressure drop elements. According to some embodiments, a pressure drop through a pressure drop element is designed to be larger than a pressure drop across the associated (downstream) cold plate (or as compared to a system without such pressure drop elements). Thus, when a heat load in a given heat load cooling path increases and results in a higher pressure drop across the given heat load cooling path, the overall pressure drop and subsequent flow rate will not be significantly affected. In some embodiments, an overall liquid-side pressure drop and pumping power requirement may increase. However, pumping powers typically are negligible in pumped two-phase cooling loops, especially when compared to compressor and fan powers. Thus, the system efficiency is not expected to be significantly affected.

Figure 2B:
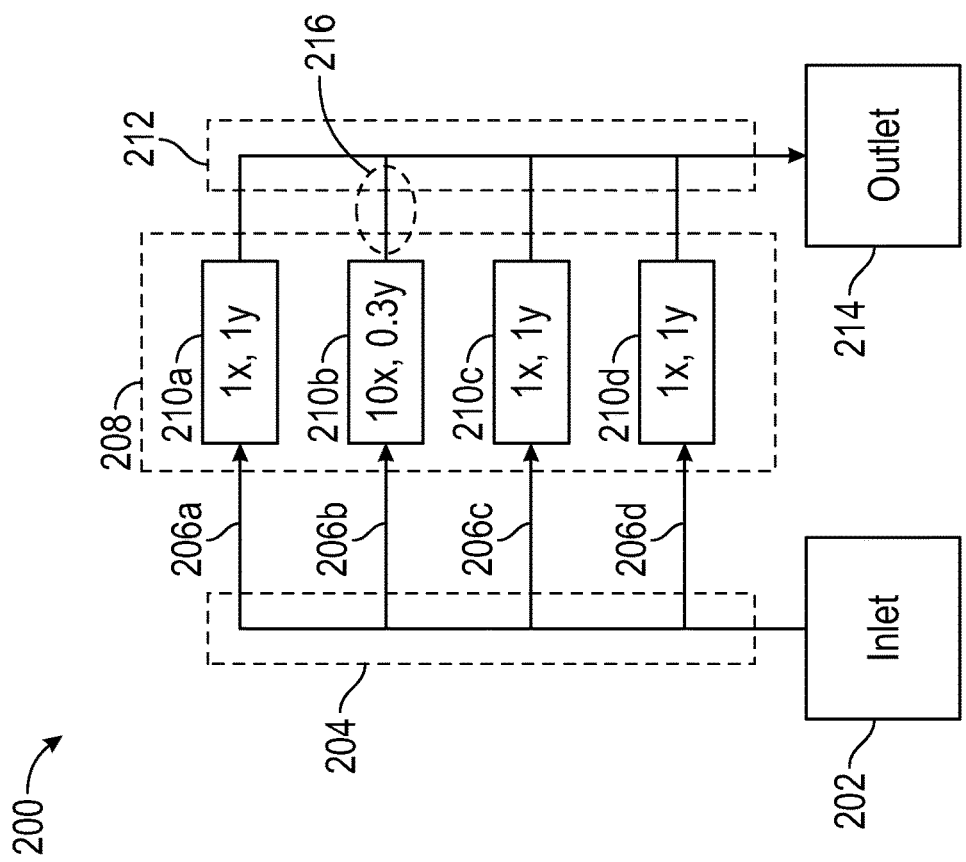
FIG. 2B illustrates the cooling system of FIG. 2A in a second state of operation.
Figure 2A:
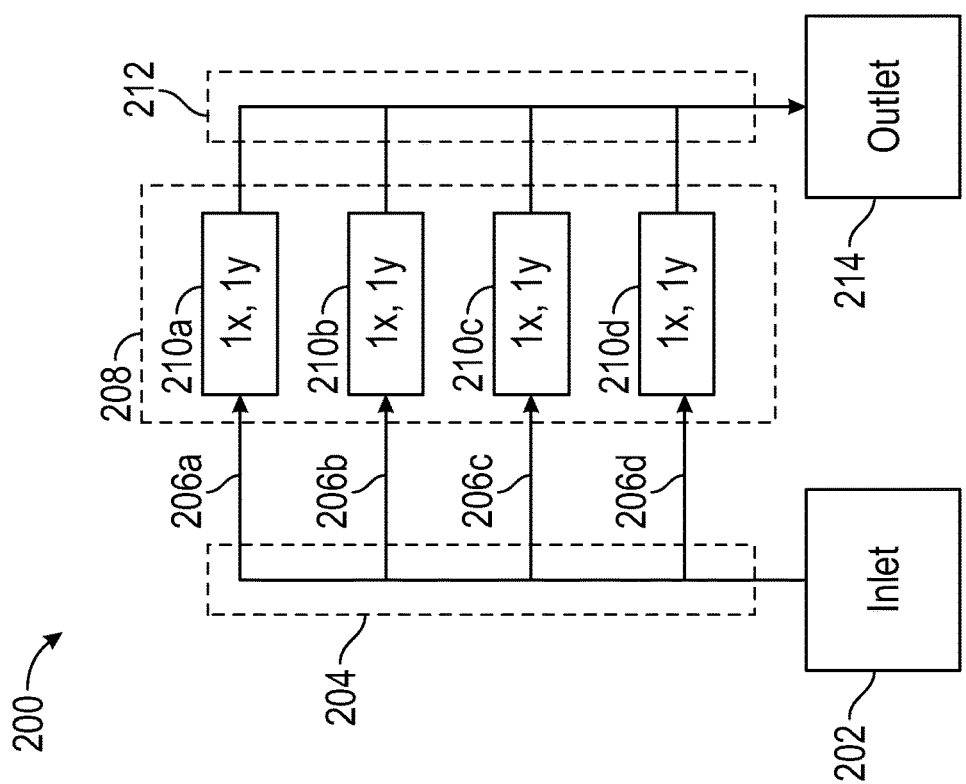
FIG. 2A is a schematic illustration of a cooling system that may incorporate embodiments of the present disclosure, in a first state of operation.

Referring now to FIGS. 2A-2B, a schematic configuration of a cooling assembly 200 in accordance with an embodiment of the present disclosure is shown. The cooling assembly 200 may be incorporated into cooling systems, such as shown and described above. As shown, the cooling assembly 200 includes an inlet 202 configured to provide or supply a two-phase cooling fluid in a liquid state. The fluid may be provided into an inlet manifold 204 and divided into multiple separate heat load cooling paths 206a, 206b, 206c, 206d. The heat load cooling paths 206a-d pass through a cold sink 208, such as a cold plate or the like. The cold sink 208 includes a number of heat loads 210a, 210b, 210c, 210d thermally coupled to the cold sink 208, with each heat load 210a-d arranged along a respective heat load cooling path 206a-d of the cold sink 208. The fluid will pass along the respective heat load cooling path 206a-d, enter an outlet manifold 212 and out an outlet 214. During the passage from the inlet manifold 204 to the outlet manifold 212, the fluid will pick up heat from the heat loads 210a-d and may change phase, such as from a liquid to a vapor. This change in state requires energy that is taken from the respective heat loads 210a-d. The outlet manifold 212 may be configured to receive a two-phase state of the fluid to be directed out the outlet 214, where the fluid may be cooled again, as described above (e.g., separator, pump, evaporator, or the like).

In an example operation, each of the heat loads 210a-d may be substantially the same. For example, each heat load 210a-d may be a 1 x kW (where x is an arbitrary load value). In such configuration, where each heat load 210a-d is the same or substantially the same, the throughflow for each heat load cooling path 206a-d will be the same or substantially the same. In the example of heat loads of 1x kW, the throughflow of each heat load cooling path 206a-d may be 1y kg/s (where y is an arbitrary flow value). This is illustratively shown/labeled in FIG. 2A. In such a configuration, the throughflows of each heat load cooling path 206a-d is the same, and thus consistent cooling and heat removal at the heat loads 210a-d may be achieved.

However, as shown in FIG. 2B, if the heat load of one of the heat loads 210a-d changes and is different from the other of the heat loads 210a-d, the result can be a disrupted flow that can impact the cooling capacity. For example, based on a similar classification of each heat load 210a-d, the first, third, and fourth heat loads 210a, 210c, 210d may all have heat loads of 1x kW and thus have a throughflow of 1y kg/s in each of the heat load cooling paths 206a, 206c, 206d, respectively. However, the second heat load 210b, in this illustrative example, may have a heat load of 10x kW (i.e., ten times greater heat load than the other heat loads). FIG. 2B is illustrative of the fact that a pressure drop in a two-phase flow increases with increasing heat flux, resulting in a high heat load component receiving less flow. In this configuration, for example, the flow through the second heat load cooling path 206b has a flow of 0.3y kg/s (as compared to 1y kg/s for each of the other heat load cooling paths 206a, 206c, 206d). This lower rate of flow can result in higher fluid temperatures, resulting in a fully vaporized portion 216 downstream from the second heat load 210b and within the outlet manifold 212. This results in maldistribution of flow, where a low flow through the heat load cooling path 206b is present for the high heat load 210b, and thus proper cooling of the heat load 210b may not be possible.

One possible solution to deal with this inherent flow maldistribution issue is via use of a thermosyphon. Thermosyphons work by using the generated vapor itself to create static pressure difference between the inlet and outlet, which drives the flow. If the heat load of a certain component increases, so does the static pressure, resulting in more flow to handle the increased heat load. However, while maldistribution is remedied, thermosyphons rely on gravity for operation and thus limits their maximum heat flux and makes them unreliable in variable g-load applications. Similarly, while capillary flow is capable of providing more flow under a higher heat load, in practice, the range of applicable heat fluxes is low. Accordingly, embodiments of the present disclosure are directed to controlling pressure drops across the heat loads, even when the heat loads are not equal, and thus achieving more efficient cooling.

Figure 3:
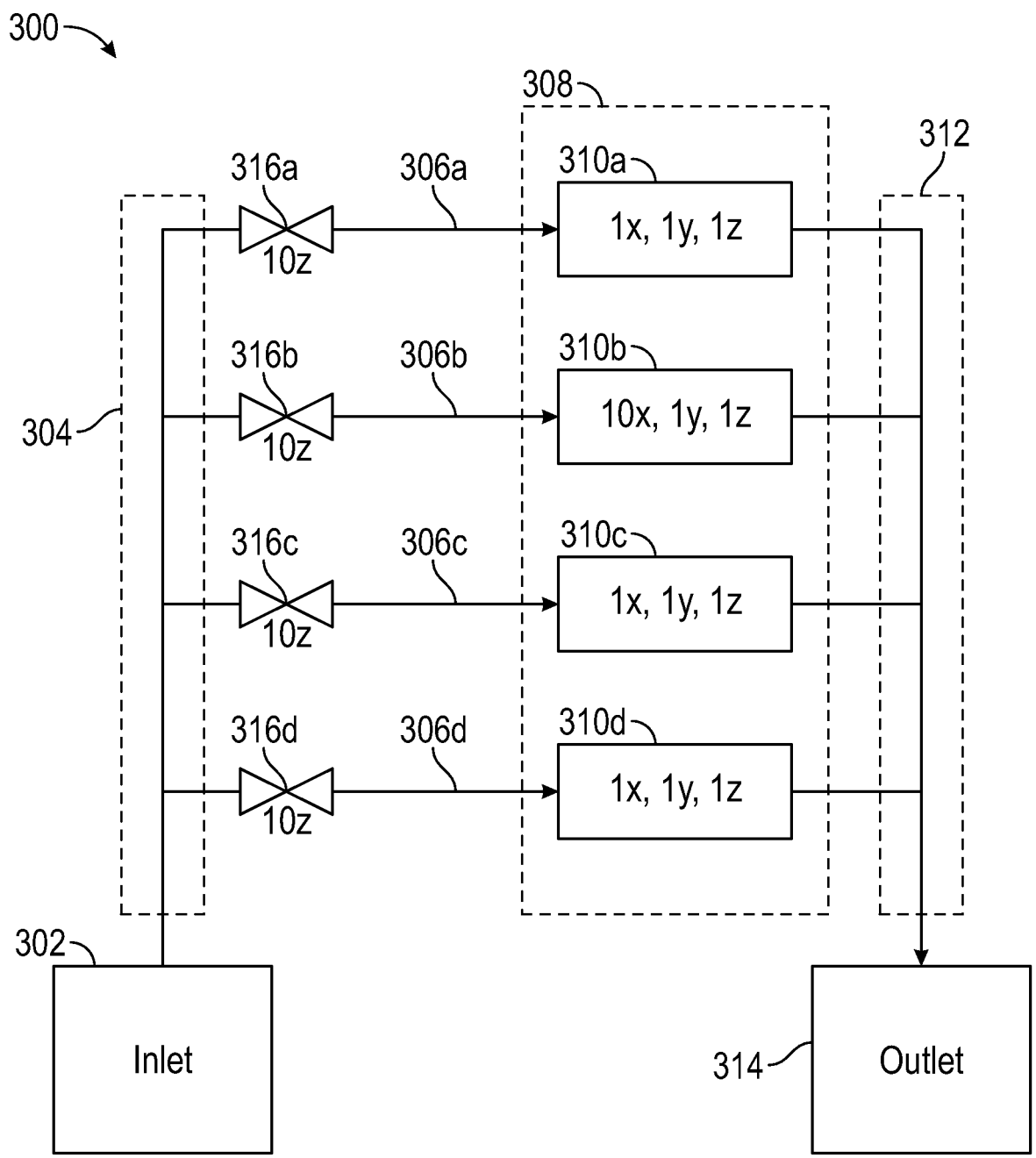
FIG. 3 is a schematic illustration of a cooling system in accordance with an embodiment of the present disclosure.

Referring now to FIG. 3, a schematic configuration of a cooling assembly 300 in accordance with an embodiment of the present disclosure is shown. The cooling assembly 300 may be incorporated into cooling systems, such as shown and described above. As shown, the cooling assembly 300 includes an inlet 302 configured to provide or supply a two-phase cooling fluid in a liquid state. The fluid may be provided into an inlet manifold 304 and divided into multiple separate heat load cooling paths 306a, 306b, 306c, 306d. The heat load cooling paths 306a-d pass through a cold sink 308, such as a cold plate or the like. The cold sink 308 includes a number of heat loads 310a, 310b, 310c, 310d thermally coupled to the cold sink 308, with each heat load 310a-d arranged along a respective heat load cooling path 306a-d of the cold sink 308. The fluid will pass along the respective heat load cooling path 306a-d, enter an outlet manifold 312 and out an outlet 314. During the passage from the inlet manifold 304 to the outlet manifold 312, the fluid will pick up heat from the heat loads 310a-d and may change phase, such as from a liquid to a vapor. This change in state requires energy that is taken from the respective heat loads 310a-d. The outlet manifold 312 may be configured to receive a vapor-phase, liquid-phase, or two-phase state of the fluid to be directed out the outlet 314, where the fluid may be cooled again, as described above (e.g., separator, pump, evaporator, or the like).

As discussed above with respect to FIGS. 2A-2B, when the heat loads change between the different heat loads 310a-d, the flow rates through the respective heat load cooling paths 306a-d may be significantly impacted. However, as shown in FIG. 3, each heat load cooling path 306a-d is configured with a respective pressure regulating elements 316a-d. The pressure regulating elements 316a-d may be high pressure drop components (e.g., valves, orifices, flow restrictors, etc.) arranged along the respective heat load cooling paths 306a-d at a position upstream of the respective heat loads 310a-d. By positioning the pressure regulating elements 316a-d upstream from the respective heat loads 310a-d, the majority of the pressure drop through each parallel heat load cooling path 306a-d occurs in the pressure regulating elements 316a-d. It will be appreciated that the pressure regulating elements may be arranged downstream from the respective heat loads, and thus the configuration shown in FIG. 3 is not intended to be limiting, but rather is provided for illustrative and explanatory purposes. The location of the pressure regulating elements is selected to ensure that the fluid is a single-phase when it passes through or across the pressure regulating elements.

Each pressure regulating element 316a-d may be set to achieve a preset pressure drop that is greater than a maximum expected pressure drop across any of the heat loads 310a-d. Because the pressure drop through the pressure regulating elements 316a-d is designed to be larger than the pressure drop across the respective heat load 310a-d along the respective heat load cooling paths 306a-d, when a heat load 310a-d in the cold sink 308 increases and results in a higher pressure drop, the overall pressure drop and subsequent flow rate will not be significantly affected. In some embodiments, because of the higher set pressure drop at the pressure regulating elements 316a-d, the overall liquid-side pressure drop and pumping power increases. Nevertheless, pumping power is typically negligible in pumped two-phase cooling loops, especially when compared to compressor and fan power requirements. Thus, the system efficiency is not expected to be significantly affected.

For example, similar to that discussed above with respect to FIGS. 2A-2B, each heat load 310a-d may have a power level of 1x kW (where x is an arbitrary load value). In the example of heat loads of 1x kW, the throughflow of each heat load cooling path 306a-d may be 1y kg/s (where y is an arbitrary flow value). In such a configuration, the throughflows of each heat load cooling path 306a-d is the same, and thus consistent cooling and heat removal at the heat loads 310a-d may be achieved. In the event that the second heat load 310b increases in load to 10x, the throughflow of 1y kg/s is not significantly altered, as it was in the embodiment of FIG. 2B, and remains at 1y kg/s. This is because the pressure drop across the second heat load 310b remains substantially constant. As shown, each heat load 310a-d has a respective pressure drop of 1z Pa. This is achieved as a result of the upstream pressure regulating elements 316a-d which are configured with greater pressure drops than the highest pressure drop achievable across each heat load 310a-d. For example, as illustratively shown in FIG. 3, each pressure regulating element 316a-d may be configured to provide a pressure drop across the respective pressure regulating element 316a-d of 10z Pa (i.e., ten times the pressure drop across the associated heat loads 310a-d). In accordance with embodiments of the present disclosure, the pressure drop across the pressure regulating elements may be any pressure drop that is greater than the highest pressure drop that would occur at the greatest heat load without such pressure regulating elements. In this example embodiment, the pressure drop is ten times greater. However, it will be appreciated that any pressure drop that is greater than the highest pressure drop that would occur at the greatest heat load without such pressure regulating elements. That is, the exact factor by which the pressure regulating elements need to be larger than the maximum pressure drop depends on the exact system and operational conditions being considered. For some configurations, the factor might have to be 10x, for others 1x might be sufficient.

In accordance with embodiments of the present disclosure, a multi-path cold sink is modified with upstream pressure regulating elements that force a pressure drop in the fluid prior to the fluid being supplied into and through the respective heat load cooling paths of the cold sink. The forced upstream pressure drop removes the flow response that is typical when a heat load is increased (e.g., as shown in FIG. 2B). In accordance with some embodiments, the pressure drops of each pressure regulating element is the same. The pressure drop of the pressure regulating elements is preset or predefined and set to be greater than a maximum pressure drop of any of the associated heat loads. The flow rates in such systems are set to accommodate the highest heat load of a given heat load operation. With the pressure drops being equal for each heat load cooling path, when a load changes at a given heat load downstream from the pressure regulating elements, the result is not as dramatic as present in systems without such pressure regulating elements (e.g., FIGS. 2A-2B).

Figure 4:
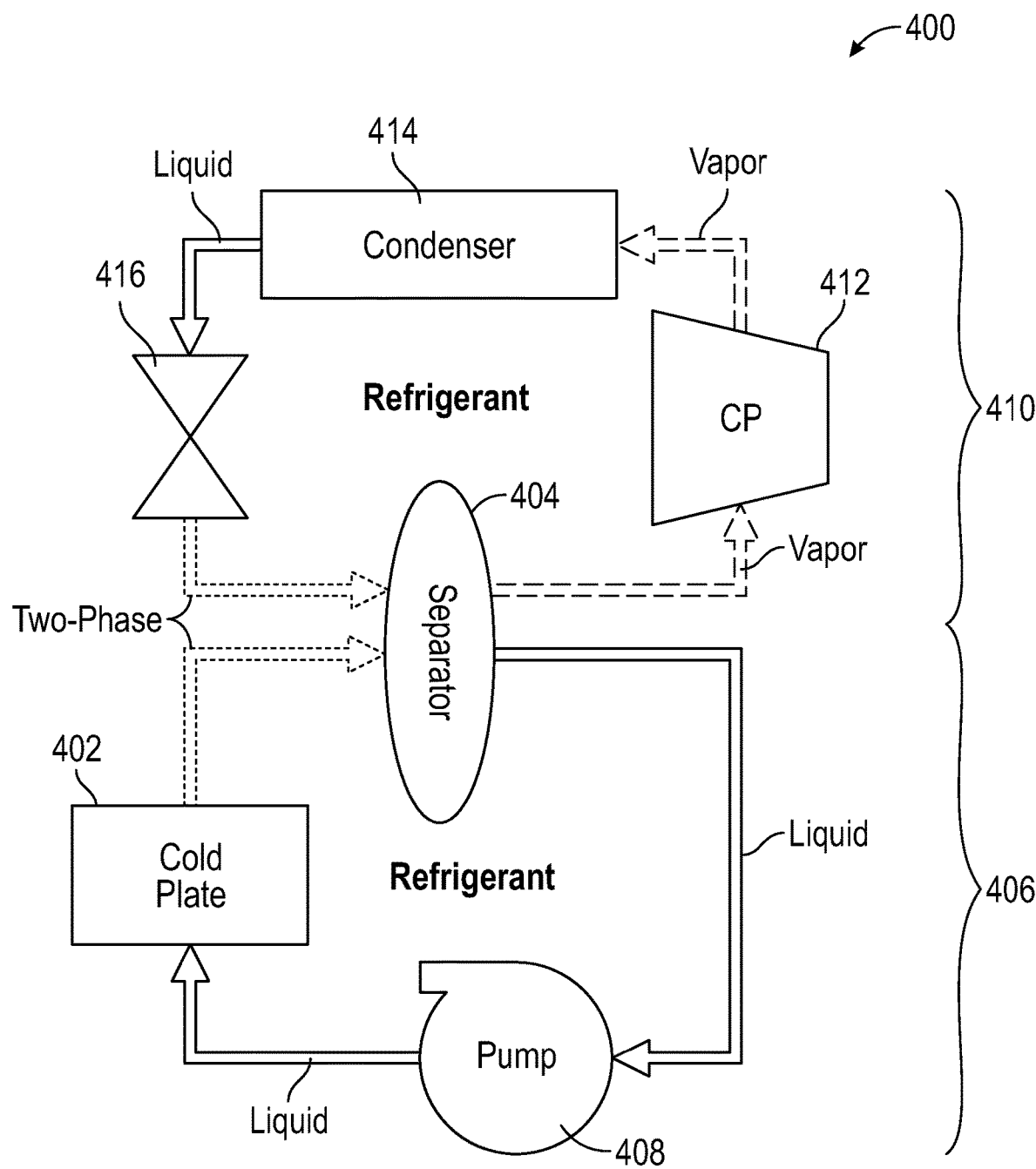
FIG. 4 is a schematic illustration of a single fluid cooling system that may incorporate embodiments of the present disclosure.

Referring now to FIG. 4, a schematic illustration of a single-fluid, two-phase cooling system 400 is shown. The system 400 may be configured to include a cold sink similar to that shown and described above. As shown, the system 400 includes a cold sink (e.g., cold plate 402) that may be thermally coupled to a plurality of heat loads (not shown) to provide cooling thereto. In this configuration, because a single fluid (e.g., a refrigerant) is used in the cycle of the system 400, a two-phase fluid may exit the cold plate 402 where heat was picked up from the coupled heat loads. The refrigerant within the system 500 may be, for example and without limitation, 1,1,1,2-Tetrafluoroethane (R-134a) or 2,3,3,3-Tetrafluoropropene (R-1234yf), although other refrigerants may be used without departing from the scope of the present disclosure. In this illustrative embodiment, the two-phase cooling fluid will be separated into liquid and vapor components within a separator 404. In a liquid loop 406 of the system 400, the liquid portion of the refrigerant sourced from the separator 404 is increased in pressure through a pump 408 and provided into the cold plate 402 for cooling purposes. The cooling fluid within the liquid loop 406 is maintained in liquid form as it enters the cold plate 402, which may include pressure regulating elements associated with each heat load that is thermally coupled to the cold plate 402.

In this embodiment, a vapor portion of the cooling fluid within the separator 404 is directed into a vapor loop 410. In the vapor loop 410, the refrigerant will be compressed within a compressor 412 and then condensed to a liquid state within a condenser 414. The liquid is then expanded into a two-phase state at a valve 416 (e.g., expansion valve, controllable valve, etc.). The two-phase fluid, from each of the liquid loop 406 and the vapor loop 410, are joined at the separator 404. The separator 404 may operate as a flash tank where the two-phases exiting the valve 416 and the cold plate 402 are separated into liquid and vapor phases by gravity or other mechanism. The system 400 provides a relatively simple complexity system that minimizes the number of components while providing for efficient cooling at a cold sink. The system 400 uses a single fluid (e.g., refrigerant, and no need for a separate coolant) and a single separator that divides the flows of fluids of the refrigerant (e.g., vapor versus liquid).

In some embodiments, an inlet manifold associated with the cold plate 402 may be arranged between the pump 408 and the cold plate 402 to receive the liquid cooling fluid. Similarly, a downstream outlet manifold may be arranged at the downstream end of the cold plate 402 to receive and combine the cooling fluid as it exits the cold plate 402. The cooling fluid may be in liquid form, two-phase form, or vapor form as it exits the cold plate 402, and then directed into the separator 404 (joined with the fluid from the vapor loop 410 before, at, or in the separator 404). The system 400 (or the other above described systems and variations thereon) may be used for cooling of aircraft heat loads, such as for powered electronics or the like.

In accordance with embodiments of the present disclosure, the pressure regulating elements may be configured to provide a predetermined change in mass flow rate of a fluid through the respective pressure regulating element. For example, in some embodiments, and without limitation, the pressure regulating elements may be configured to restrict or reduce a mass flow rate by 10%-90%, depending on the specific configuration, heat loads, etc. In some embodiments, the pressure regulating elements may be configured to reduce the mass flow rate by 10%-70%, 15%-50%, 20%-45%, 20%-30%, etc. It will be appreciated that the reduction in mass flow rate may be set at a single or small range of values for highly tuned or configuration systems (e.g., reduction in mass flow rate of about 25%, 30%, 45%, 60%, etc.).

Figure 5A:
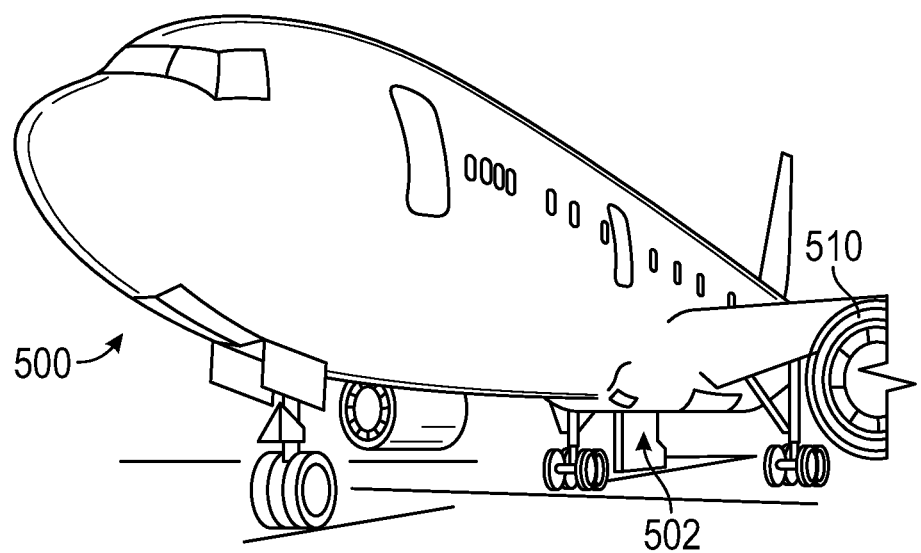
FIG. 5A is a schematic illustration of an aircraft that can incorporate various embodiments of the present disclosure.
Figure 5B:
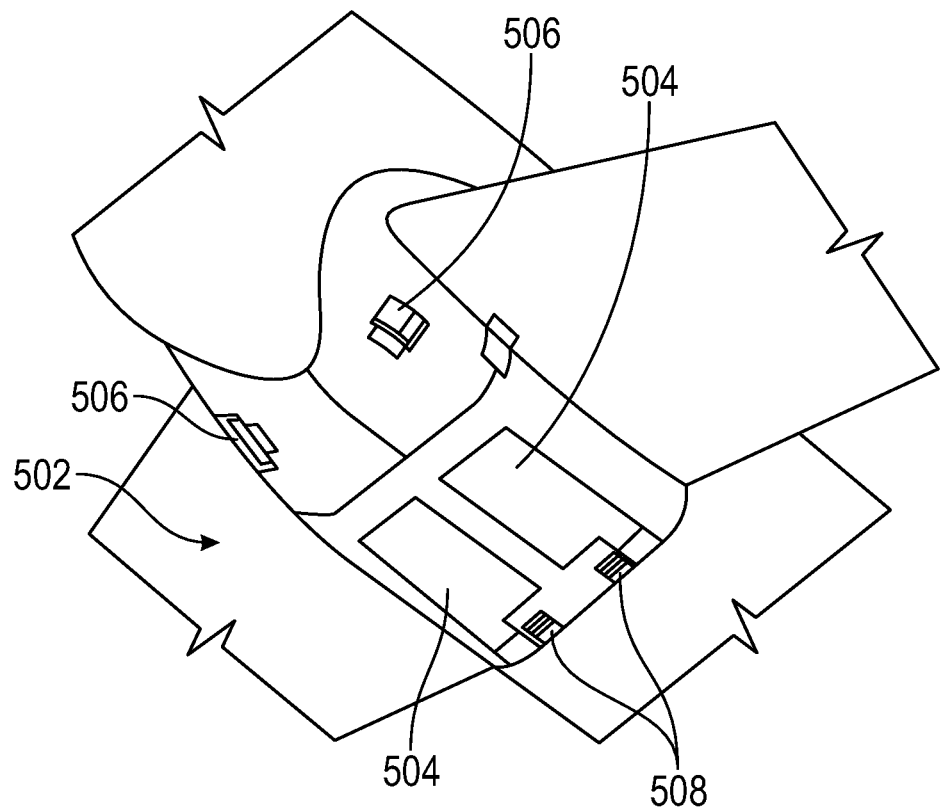
FIG. 5B is a schematic illustration of a bay section of the aircraft of FIG. 5A.

FIGS. 5A-5B are schematic illustrations of an aircraft 500 that can employ one or more embodiments of the present disclosure. As shown in FIGS. 5A-5B, the aircraft 500 includes bays 502 beneath a center wing box. The bays 502 can contain and/or support one or more components of the aircraft 500. For example, in some configurations, the aircraft 500 can include environmental control systems, electronics systems, and/or fuel tank inerting systems within the bays 502. As shown in FIG. 5B, the bays 502 include bay doors 504 that enable installation and access to one or more components (e.g., environmental control systems, electronics systems, fuel tank inerting systems, etc.). During operation of the onboard systems and components of the aircraft 500, air that is external to the aircraft 500 can be provided to such systems within the bay doors 504 through one or more ram air inlets 506. The air may then flow through the systems to be processed and supplied to various components or locations within the aircraft 500 (e.g., flight deck, passenger cabin, etc.). Some air may be exhausted through one or more ram air exhaust outlets 508. The condensers described above, and part of the cooling systems, may be arranged in fluid or thermal interaction with the ram air or may be arranged within ram air ducts of the aircraft, for aircraft applications of the cooling systems described herein.

Also shown in FIG. 5A, the aircraft 500 includes one or more engines 510. The engines 510 are typically mounted on wings of the aircraft 500, but may be located at other locations depending on the specific aircraft configuration. In some aircraft configurations, air can be bled from the engines 510 and supplied to the onboard systems, as will be appreciated by those of skill in the art.

It will be appreciated that the cooling systems or portions thereof, such as those shown and described above, may be installed onboard an aircraft, such as aircraft 500 shown in FIGS. 5A-5B. The cooling systems may be configured to cool onboard heat loads. These onboard employments may be thermally coupled to or include a cold sink or cold plate which functions as shown and described above. As such, a portion of the fluid of the cooling systems described above may be passed through or used to cool such heat loads. In some embodiments, the cooling required at the condensers of the systems to generate the liquid state of the fluid in the vapor loops may be provided by a condenser arranged in a ram air duct or configured to receive such air (or treated air). Although shown to be implemented onboard an aircraft, it will be appreciated that embodiments of the present disclosure may be employed in systems such as motor cooling in electric vehicles, server rack cooling in data centers, or the like.

Advantageously, embodiments described herein provide for improved efficiency cooling systems and cycles. For example, fewer structural components may be required in the systems shown and described herein, thus resulting in lower complexity systems and lower weight. Additionally, embodiments of the present disclosure provide for single-fluid, multi-phase cooling systems that maintain consistent pressure drops and thus flow rates within and through the cold sinks of the systems. In accordance with embodiments of the present disclosure, the upstream pressure regulating elements provide a response that is instantaneous and passive, and accordingly, can never fail. That is, by forcing a pressure drop upstream from the heat loads on the cold sink, the flow through the cold sink is not substantially altered, as the primary pressure drop is forced at an upstream location from the heat loads. Further, although pumping power will be increased to achieve the higher pressure drop at the upstream location, such increase in pump is a relatively small contribution to an overall system power consumption, and thus the effect on system efficiency will be negligible as compared to the improvements achieved by inclusion of the pressure regulating elements.

The use of the terms "a", "an", "the", and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. As used herein, the terms "about" and "substantially" are intended to include the degree of error associated with measurement of the particular quantity based upon the equipment available at the time of filing the application. For example, the terms may include a range of ±8%, or 5%, or 2% of a given value or other percentage change as will be appreciated by those of skill in the art for the particular measurement and/or dimensions referred to herein.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description but is only limited by the scope of the appended claims.

What is claimed is:

1. A cooling system comprising:
    a cold sink comprising a plurality of heat load cooling paths;
    a heat load associated with each heat load cooling path of the plurality of heat load cooling paths;
    an inlet configured to supply a cooling fluid into the cold sink;
    an outlet configured to receive the cooling fluid after passing through the plurality of heat load cooling paths of the cold sink; and
    a pressure regulating element arranged along each heat load cooling path, each pressure regulating element arranged between the inlet and the heat load along each heat load cooling path and configured to cause a pressure drop in the cooling fluid prior to passing the cooling fluid to each heat load,
    wherein the pressure drop caused by each pressure regulating element is the same and is a pressure drop greater than a maximum pressure drop across each heat load of a system without such pressure regulating elements, wherein the pressure drop of each pressure regulating element is at least ten times greater than the maximum pressure drop.

2. The cooling system of claim 1, wherein the cooling fluid is 1,1,1,2-Tetrafluoroethane (R-134a), a mixture of difluoromethane and pentafluoroethane (R-410A), 2,3,3,3-Tetrafluoropropene (R-1234yf), or 1,1,1,3,3,3-Hexafluoropropane (236fa).

3. The cooling system of claim 1, wherein the heat load is a powered electronics component of an aircraft.

4. The cooling system of claim 1, further comprising a pump arranged upstream of the inlet.

5. The cooling system of claim 1, further comprising an evaporator arranged downstream of the outlet.

6. The cooling system of claim 1, further comprising an inlet manifold arranged between the inlet and the pressure regulating elements.

7. The cooling system of claim 1, further comprising an outlet manifold arranged between the heat loads and the outlet.

8. The cooling system of claim 1, wherein each pressure regulating element is a valve.

9. The cooling system of claim 8, wherein each pressure regulating element is an orifice along each heat load cooling path.

10. The cooling system of claim 1, wherein the cooling fluid is a liquid at the inlet and a two-phase fluid at the outlet.

11. The cooling system of claim 10, further comprising a separator arranged downstream from the outlet and configured to receive the cooling fluid and separate such fluid into a liquid flow path and a vapor flow path, wherein each of the liquid flow path and a vapor flow path define a closed-loop system centered on the cold sink.

12. An aircraft cooling system comprising:
    a plurality of aircraft heat loads; and
    cooling system comprising:
        a cold sink comprising a plurality of heat load cooling paths, wherein each heat load cooling path is associated with one of the plurality of aircraft heat loads;
        an inlet configured to supply a cooling fluid into the cold sink;
        an outlet configured to receive the cooling fluid after passing through the plurality of heat load cooling paths of the cold sink; and
        a pressure regulating element arranged along each heat load cooling path, each pressure regulating element arranged between the inlet and the heat load along each heat load cooling path and configured to cause a pressure drop in the cooling fluid prior to passing the cooling fluid to each heat load,
wherein the pressure drop caused by each pressure regulating element is the same and is a pressure drop greater than a maximum pressure drop across each heat load of a system without such pressure regulating elements.

13. The aircraft cooling system of claim 12, wherein the heat load comprises at least one power electronics component of an aircraft.

14. The aircraft cooling system of claim 12, wherein the pressure drop of each pressure regulating element is at least ten times greater than the maximum pressure drop.

15. The aircraft cooling system of claim 12, further comprising an inlet manifold arranged between the inlet and the pressure regulating elements and an outlet manifold arranged between the heat loads and the outlet.

16. The aircraft cooling system of claim 12, wherein each pressure regulating element is a one of a valve or an orifice along each heat load cooling path.

17. The aircraft cooling system of claim 12, wherein the cooling fluid is a liquid at the inlet and a two-phase fluid at the outlet.

18. A cooling system comprising:
a cold sink comprising a plurality of heat load cooling paths;
a heat load associated with each heat load cooling path of the plurality of heat load cooling paths;
an inlet configured to supply a cooling fluid into the cold sink;
an outlet configured to receive the cooling fluid after passing through the plurality of heat load cooling paths of the cold sink; and
a pressure regulating element arranged along each heat load cooling path, each pressure regulating element arranged between the inlet and the heat load along each heat load cooling path and configured to cause a pressure drop in the cooling fluid prior to passing the cooling fluid to each heat load,
wherein the pressure drop caused by each pressure regulating element is the same and is a pressure drop greater than a maximum pressure drop across each heat load of a system without such pressure regulating elements,
wherein the cooling fluid is a liquid at the inlet and a two-phase fluid at the outlet, and
a separator arranged downstream from the outlet and configured to receive the cooling fluid and separate such fluid into a liquid flow path and a vapor flow path, wherein each of the liquid flow path and a vapor flow path define a closed-loop system centered on the cold sink.

19. The cooling system of claim 18, further comprising a pump arranged downstream from the separator and upstream of the cold sink along the liquid flow path, the pump configured to boost a pressure of the cooling fluid in the liquid flow path.

20. The cooling system of claim 18, further comprising a compressor, a condenser, and an expansion valve arranged along the vapor flow path downstream from the separator and upstream from the cold sink.

\* \* \* \* \*